United States Patent
Varghese et al.

(10) Patent No.: US 12,100,783 B2
(45) Date of Patent: Sep. 24, 2024

(54) OPTOELECTRONIC SEMICONDUCTOR BODY HAVING A LAYER STACK, ARRANGEMENT OF A PLURALITY OF OPTOELECTRONIC SEMICONDUCTOR BODIES HAVING A LAYER STACK, AND METHOD FOR PRODUCING SAID OPTOELECTRONIC SEMICONDUCTOR BODY

(71) Applicant: OSRAM OLED GmbH, Regensburg (DE)

(72) Inventors: Tansen Varghese, Regensburg (DE); Adrian Stefan Avramescu, Regensburg (DE)

(73) Assignee: OSRAM OLED GMBH, Regensburg (DE)

(*) Notice: Subject to any disclaimer, the term of this patent is extended or adjusted under 35 U.S.C. 154(b) by 25 days.

(21) Appl. No.: 17/050,793

(22) PCT Filed: Apr. 11, 2019

(86) PCT No.: PCT/EP2019/059324
§ 371 (c)(1),
(2) Date: Oct. 26, 2020

(87) PCT Pub. No.: WO2019/206669
PCT Pub. Date: Oct. 31, 2019

(65) Prior Publication Data
US 2021/0226090 A1    Jul. 22, 2021

(30) Foreign Application Priority Data
Apr. 27, 2018  (DE) .................... 102018110187.2

(51) Int. Cl.
*H01L 21/00*    (2006.01)
*H01L 27/15*    (2006.01)
(Continued)

(52) U.S. Cl.
CPC .......... *H01L 33/20* (2013.01); *H01L 27/156* (2013.01); *H01L 33/0062* (2013.01);
(Continued)

(58) Field of Classification Search
CPC .................... H01L 33/44; H01L 33/20
See application file for complete search history.

(56) References Cited

U.S. PATENT DOCUMENTS 5,242,857 A * 9/1993 Cooper ................ H01S 5/227
                                                  438/504
5,441,912 A * 8/1995 Tsukiji ................ H01S 5/2275
                                                  148/DIG. 95
(Continued)

FOREIGN PATENT DOCUMENTS

DE    102015107593 A1    11/2016
EP       2264793 A2      12/2010

OTHER PUBLICATIONS

Chen et al., "Study and application of the mass transport phenomenon in InP", Journal of Applied Physics, 1983, vol. 54, Issue 5, 5 pages.

(Continued)

*Primary Examiner* — Ismail A Muse
(74) *Attorney, Agent, or Firm* — MH2 TECHNOLOGY LAW GROUP LLP (57) ABSTRACT

An optoelectronic semiconductor body is provided with a layer stack with an active region which is configured to emit electromagnetic radiation and which includes a main extension plane, wherein the layer stack comprises side walls which extend transversely to the main extension plane of the active region, and the side walls are covered at least in places with a cover layer which is formed with at least one semiconductor material. In addition, an arrangement of a plurality of optoelectronic semiconductor bodies and a (Continued)

method for producing an optoelectronic semiconductor body are provided.

14 Claims, 6 Drawing Sheets

(51) Int. Cl.
| | |
|---|---|
| *H01L 33/00* | (2010.01) |
| *H01L 33/20* | (2010.01) |
| *H01S 5/02* | (2006.01) |
| *H01S 5/04* | (2006.01) |
| *H01S 5/042* | (2006.01) |
| *H01L 33/16* | (2010.01) |

(52) U.S. Cl.
CPC ........ *H01L 33/0095* (2013.01); *H01S 5/0201* (2013.01); *H01S 5/041* (2013.01); *H01S 5/042* (2013.01); *H01L 33/16* (2013.01); *H01S 2304/04* (2013.01)

(56) References Cited

U.S. PATENT DOCUMENTS

| | | | | |
|---|---|---|---|---|
| 5,452,315 | A * | 9/1995 | Kimura | H01S 5/227 372/46.01 |
| 6,011,811 | A * | 1/2000 | Ohlander | B82Y 20/00 438/22 |
| 6,028,875 | A * | 2/2000 | Knight | B82Y 20/00 372/45.01 |
| 6,110,756 | A * | 8/2000 | Otsuka | B82Y 20/00 438/22 |
| 6,775,308 | B2 | 8/2004 | Hamster | G02B 6/4206 372/28 |
| 6,982,469 | B2 * | 1/2006 | Kondo | B82Y 20/00 257/432 |
| 7,060,518 | B2 * | 6/2006 | Kondo | G02F 1/01708 438/47 |
| 7,195,991 | B2 * | 3/2007 | Karnutsch | H01L 33/30 257/E21.112 |
| 7,274,720 | B2 * | 9/2007 | Asano | H01S 5/227 372/43.01 |
| 8,928,004 | B2 * | 1/2015 | Choe | H01L 21/02458 438/478 |
| 10,355,150 | B2 * | 7/2019 | Knorr, Jr. | H01L 31/184 |
| 2002/0048023 | A1 * | 4/2002 | Numai | H01S 5/1071 356/459 |
| 2005/0201440 | A1 * | 9/2005 | Asano | B82Y 20/00 372/43.01 |
| 2008/0032435 | A1 * | 2/2008 | Watatani | B82Y 20/00 438/46 |
| 2013/0210178 | A1 | 8/2013 | Li et al. | |
| 2014/0370683 | A1 * | 12/2014 | Cheng | H01L 29/7317 438/311 |
| 2015/0063392 | A1 * | 3/2015 | Takayama | H01S 5/0287 372/45.01 |
| 2015/0188007 | A1 * | 7/2015 | Mochizuki | C08K 5/5435 252/301.36 |
| 2017/0077352 | A1 * | 3/2017 | Kondo | H01L 33/38 |
| 2017/0323873 | A1 * | 11/2017 | Lin | H01L 24/05 |
| 2017/0365692 | A1 * | 12/2017 | Leobandung | H01L 29/32 |
| 2018/0097145 | A1 * | 4/2018 | Bour | H01L 33/0025 |
| 2018/0138368 | A1 * | 5/2018 | Jang | H01L 33/405 |
| 2018/0283621 | A1 * | 10/2018 | Tischler | H05B 45/30 |
| 2018/0331253 | A1 * | 11/2018 | Grandusky | H01L 33/0093 |
| 2021/0226102 | A1 * | 7/2021 | Rosenius | H01L 33/60 |

OTHER PUBLICATIONS

Gessmann et al., "High-efficiency AlGaInP light-emitting diodes for solid-state lighting applications", Journal of Applied Physics, Mar. 1, 2004, vol. 95, No. 5, 15 pages.

Goto et al., "Selective growth of InP by MOCVD around dry-etched mesas having various patterns for photonic integrated circuits", Journal of Electronic Materials, Mar. 1996, vol. 25, No. 3, 4 pages.

Groves et al., "GaInP mass transport and GaInP/GaAs buriedheterostructure lasers", Applied Physics Letters, 1990, vol. 56, No. 4, 7 pages.

Liau et al., "Surface-energy-induced mass-transport phenomenon in annealing of etched compound semiconductor structures: Theoretical modeling and experimental confirmation", Journal of Applied Physics, 1990, vol. 67, No. 5, 9 pages.

Streetman et al., "Crystal Properties and Growth of Semiconductors", Solid State Electronic Devices 7th Edition, Chapter 1, 2015, 30 pages.

* cited by examiner

OPTOELECTRONIC SEMICONDUCTOR BODY HAVING A LAYER STACK, ARRANGEMENT OF A PLURALITY OF OPTOELECTRONIC SEMICONDUCTOR BODIES HAVING A LAYER STACK, AND METHOD FOR PRODUCING SAID OPTOELECTRONIC SEMICONDUCTOR BODY

CROSS-REFERENCE TO RELATED APPLICATIONS

This patent application is a national stage entry from International Application No. PCT/EP2019/059324, filed on Apr. 11, 2019, published as International Publication No. WO 2019/206669 A1 on Oct. 31, 2019, and claims priority under 35 U.S.C. § 119 from German patent application 10 2018 110 187.2, filed Apr. 27, 2018, the entire contents of all of which are incorporated by reference herein.

An optoelectronic semiconductor body, an arrangement of a plurality of optoelectronic semiconductor bodies, and a method for producing an optoelectronic semiconductor body are provided.

One task to be solved is to provide an optoelectronic semiconductor body that can be operated efficiently. A further task to be solved is to provide an arrangement of a plurality of optoelectronic semiconductor bodies which can be operated efficiently. A further task to be solved is to provide a method for producing an optoelectronic semiconductor body which can be operated efficiently.

According to at least one embodiment of the optoelectronic semiconductor body, the optoelectronic semiconductor body comprises a layer stack with a p-doped region, an active region which is in particular configured to emit and/or receive electromagnetic radiation during operation of the optoelectronic semiconductor body and which comprises a main extension plane, and an n-doped region. The layer stack can comprise a stack direction. The p-doped region, the active region and the n-doped region can be arranged above one another in the stack direction. The semiconductor body can further comprise a substrate on which the layer stack is arranged. For example, the substrate can be formed with GaAs, GaN, InP, GaSb, InAs, Ge or GaP. The semiconductor body can be a three-dimensional body, which, for example, comprises the shape of a cuboid or a cylinder. The semiconductor body can comprise a main extension plane which is parallel to one of the cover surfaces of the cuboid or cylinder.

The p-doped region is doped with at least one p-dopant. The p-doped region may comprise one or more p-doped semiconductor layers. Furthermore, the p-doped region can extend over the entire lateral extension of the layer stack. The lateral extension of the layer stack is parallel to the main extension plane of the semiconductor body.

The main extension plane of the active region can be parallel to the main extension plane of the semiconductor body. The active region can extend over the entire lateral extension of the layer stack. Furthermore, the active region can be configured to emit light during operation. The active region may comprise at least one quantum well structure. For example, the active region can be formed with InGaN, InGaAsP, InGaAlAs or InGaAlP.

The n-doped region is doped with at least one n-dopant. The n-doped region may comprise one or more n-doped semiconductor layers. Furthermore, the n-doped region can extend over the entire lateral extension of the layer stack.

The p-doped region and the n-doped region can be based on a III-V semiconductor compound. For example, the p-doped region and the n-doped region can be formed with InP or InAlP. It is further possible that the active region is formed with InGaAlP and the p-doped region and the n-doped region are formed with InAlP.

In particular, the semiconductor body can be based on a III-V semiconductor compound, preferably a phosphide compound semiconductor material. "Based on a phosphide compound semiconductor material" means in this context that the semiconductor body or at least a part thereof comprises $Al_nGa_mIn_{1-n-m}P$ or $In_uGa_{(1-u)}As_vP_{(1-v)}$, wherein $0 \leq n \leq 1$, $0 \leq m \leq 1$ and $n+m \leq 1$. This material does not necessarily have to comprise a mathematically exact composition according to the above formula. Rather, it may comprise one or more dopants and additional components. For simplicity's sake, however, the above formula only includes the essential components of the crystal lattice (Al or As, Ga, In, P), even if these may be partially replaced by small amounts of other substances.

According to at least one embodiment of the optoelectronic semiconductor body, the active region is arranged in stack direction between the p-doped region and the n-doped region. This can mean that the active region is applied on the p-doped region and the n-doped region is applied on the active region. It is further possible that the active region is applied on the n-doped region and the p-doped region is applied on the active region.

According to at least one embodiment of the optoelectronic semiconductor body, the layer stack comprises side walls which extend transversely to the main extension plane of the active region. The side walls may extend in the region of the p-doped region, the active region and the n-doped region. For example, the side walls can extend transversely or perpendicularly to the main extension plane of the active region. If the layer stack comprises the shape of a cuboid, for example, the side walls can form the lateral surface of the cuboid. It is further possible that the layer stack comprises a hexagonal shape in a plane parallel to the main extension plane of the active region. In this case, the layer stack may comprise six side walls.

According to at least one embodiment of the optoelectronic semiconductor body, the side walls are covered at least in places with a cover layer which is formed with at least one semiconductor material. The side walls may, for example, be covered with the cover layer in the region of the active region. It is further possible that the cover layer completely covers the side walls. The cover layer may have been grown on the side walls. In particular, the cover layer can be an epitaxially grown layer. The cover layer may comprise a semiconductor compound.

In particular, the material of the cover layer can be based on a III-V or a II-VI semiconductor material.

For example, the cover layer can be formed with GaN, AlGaP, InAlP or ZnSSe. The cover layer can be n-doped and/or p-doped. It is further possible that the cover layer is undoped, in particular nominally. In addition, it is possible that the cover layer comprises a plurality of layers which are arranged above one another. For example, the layers can be doped differently, for example n-doped, p-doped or undoped. N-doped and p-doped layers can be arranged alternately above one another. For example, the cover layer comprises an n-doped layer and a p-doped layer. Thus, the cover layer may comprise a p-n transition. This transition can be reversed in comparison to the p-n transition of the layer stack. This prevents or reduces the current flow from the layer stack into the cover layer. The cover layer can therefore act as a current blocker.

In a lateral direction, which is parallel to the main extension plane of the active region and/or perpendicular to the covered side wall, the cover layer comprises a thickness. The thickness of the cover layer in a lateral direction can be at least 5 nm. It is further possible that the thickness of the cover layer in lateral direction is at most 1 μm or at most 500 nm. If the active region is formed with InGaAlP, the cover layer is preferably formed with InAlP or ZnSSe. In this case, the lattice mismatch between the material of the cover layer and the material of the layer stack is very small. Furthermore, InAlP and ZnSSe comprise a larger band gap than InGaAlP. The thickness of the cover layer in lateral direction can be inhomogeneous. This can mean that the thickness of the cover layer comprises different values at different positions along the covered side wall. The thickness then fluctuates, for example, by at least 10%, in particular by at least 20% around an average value of the thickness.

According to at least one embodiment of the optoelectronic semiconductor body, the optoelectronic semiconductor body comprises a layer stack with an active region which is configured to emit electromagnetic radiation and which comprises a main extension plane, wherein the layer stack comprises side walls which extend transversely to the main extension plane of the active region, and the side walls are covered at least in places with a cover layer which is formed with at least one semiconductor material.

According to at least one embodiment of the optoelectronic semiconductor body, the optoelectronic semiconductor body comprises a layer stack with a p-doped region, an active region which is configured to emit and/or detect electromagnetic radiation during operation of the optoelectronic semiconductor body and which comprises a main extension plane, and an n-doped region, wherein the active region is arranged in the stack direction between the p-doped region and the n-doped region, the layer stack comprises side walls which extend transversely to the main extension plane of the active region, and the side walls are covered at least in places with a cover layer which is formed with at least one semiconductor material.

The optoelectronic semiconductor body described here is based, among other things, on the idea that atoms or molecules of the cover layer can bind to unpaired or free bonds on the side walls in the region of the active region. The shape of the layer stack can be produced by etching, for example. Subsequently, atoms or molecules of the active region can comprise unpaired bonds in the region of the side walls. Unpaired bonds in the region of the side walls can lead to recombination currents in the region of the side walls. This is usually undesirable because the recombination currents can lead to a reduction in the intensity of the emitted electromagnetic radiation or to a reduction in the signal-to-noise ratio. In addition, the probability of failure may be increased and reliability reduced. Due to growing the cover layer on the side walls, atoms or molecules of the cover layer can bind to the unpaired bonds, in particular through covalent bonds. The cover layer can thus act as a passivation for the unpaired bonds. Since the number of unpaired bonds in the region of the side walls is reduced by the application of the cover layer, the occurrence of recombination currents during operation of the semiconductor body is reduced. The semiconductor body can thus be operated more efficiently, as the probability of non-radiative recombination is reduced.

According to at least one embodiment of the optoelectronic semiconductor body, the cover layer completely covers the active region on the side walls. The active region can be exposed in the region of the side walls. This means that a part of the active region can form a part of the side walls. The part of the active region that forms part of the side walls is completely covered by the cover layer. It is further possible that the cover layer completely covers the side walls in the region of the active region. Thus, atoms or molecules of the cover layer can bind to unpaired bonds of the active region. This prevents recombination currents in the region of the side walls.

According to at least one embodiment of the optoelectronic semiconductor body, at least one of the side walls encloses an angle of 90° or less than 90° with the main extension plane of the active region. This can mean that at least one of the side walls or the side walls can extend perpendicularly to the main extension plane of the active region or at an angle of less than 90°. It is further possible that the side walls comprise a curved or not straight shape. The shape of the side walls can be formed, for example, by etching in such a way that atoms of the cover layer can easily bind to unpaired bonds of the active region. In addition, it is possible that different side walls comprise different shapes. For example, different side walls may enclose different angles with the main extension plane of the active region.

According to at least one embodiment of the optoelectronic semiconductor body, at least one of the side walls encloses an angle greater than 90° with the main extension plane of the active region. It is also possible that each of the side walls forms an angle greater than 90° with the main extension plane of the active region. Alternatively, at least one of the side walls may enclose an angle greater than 90° with the main extension plane of the active region and at least one other of the side walls may enclose an angle of 90° or less with the main extension plane of the active region. The shape of the side walls can be used to facilitate the bonding of atoms to unpaired bonds of the active region.

According to at least one embodiment of the optoelectronic semiconductor body, the cover layer does not comprise a (111)A surface on its upper surface. The upper surface of the cover layer is the side of the cover layer which is facing away from the layer stack. A (111)A surface can comprise an undesirably high number of defects or can grow three-dimensionally, which can also be undesirable.

According to at least one embodiment of the optoelectronic semiconductor body, the lattice mismatch between the material of the cover layer and the material of the layer stack is less than 1%. The cover layer may be formed with a first material comprising a first lattice constant. The layer stack may be formed with a second material comprising a second lattice constant. The first lattice constant may differ from the second lattice constant by less than 1%. A larger difference between the first lattice constant and the second lattice constant could lead to the formation of undesired defects. A marginal lattice mismatch between the material of the cover layer and the material of the layer stack allows epitaxial growth of the cover layer on the side walls. Atoms of the cover layer can bind to unpaired bonds of the active region. Thus, recombination currents can be avoided and the semiconductor body can be operated more efficiently.

Alternatively, it is possible that the lattice mismatch between the material of the cover layer and the material of the layer stack is at least 1%. A lattice mismatch between the cover layer and the layer stack can cause stresses in the cover layer, which can increase the band gap of the material of the cover layer. Therefore, the band gap of the material of the cover layer can be increased advantageously without using another material. In this case, the cover layer preferably comprises a thickness of 100 nm or less in lateral direction. In order to reduce the total stress of the cover layer, the cover layer can comprise a number of layers. Thus, in regions of the cover layer which are not directly adjacent to the side walls, the stress can be reduced.

The material of the cover layer can be grown with the same crystallographic orientation as the material of the layer stack. This means that the material of the cover layer can adapt the crystallographic orientation of the material of the layer stack.

According to at least one embodiment of the optoelectronic semiconductor body, the band gap of the material of the cover layer is larger than the band gap of the material of the layer stack. This can mean that the band gap of the first material is larger than the band gap of the second material. Therefore, the conduction and valence bands of the first material and the second material can be offset to one another. At the transition between the active region and the cover layer, the conduction bands and/or the valence bands may comprise a discontinuity. In addition, the conduction bands and/or the valence bands may be bent in the region of the transition. This reduces the current density between the active region and the cover layer. Thus, fewer charge carriers are available for recombination currents in the region of the side walls, which reduces the recombination currents.

According to at least one embodiment of the optoelectronic semiconductor body, covalent bonds exist between the material of the side walls and the material of the cover layer. This can mean that covalent bonds exist between atoms or molecules of the cover layer and the layer stack in the region of the side walls. For example, atoms or molecules of the cover layer can covalently bind to unpaired bonds in the region of the side walls. This can reduce the occurrence of recombination currents during operation of the semiconductor body. Furthermore, ionic bonds can exist between the material of the side walls and the material of the cover layer.

According to at least one embodiment of the optoelectronic semiconductor body, an upper surface of the layer stack is free of the cover layer. The upper surface of the layer stack is arranged on the side of the layer stack facing away from the substrate. The upper surface of the layer stack can, for example, be a radiation exit side. On the upper surface, a mask layer comprising a dielectric material can be arranged. The mask layer can be used during etching and to protect the upper surface during the growth of the cover layer. The mask layer can protect the upper surface from parasitic polycrystalline growth of unwanted material on the upper surface. Parasitic growth on the mask layer can be avoided by keeping the cover layer free of aluminum. To avoid absorption by the cover layer of electromagnetic radiation emitted from the active region during operation, the upper surface of the layer stack is free of the cover layer.

According to at least one embodiment of the optoelectronic semiconductor body, the side walls are free of traces of a separation process. Traces of a separation process can be traces of a sawing process, for example. A surface that shows traces of a separation process can be roughened by, for example, a sawing process, a laser process or a plasma-based separation process. The side walls can be completely covered with the cover layer. Thus, the optoelectronic semiconductor body can be separated through the cover layer in a separation process. This prevents damage to the side walls during the separation process.

According to at least one embodiment of the optoelectronic semiconductor body, the optoelectronic semiconductor body is an electrically pumpable emitter. The optoelectronic semiconductor body can therefore be the semiconductor body of an optoelectronic semiconductor chip, for example. For example, the semiconductor chip may be a luminescent diode chip such as a light emitting diode chip or a laser diode chip. The semiconductor chip may comprise connection points for electrical contacting. By applying the cover layer to the side walls, the emitter can be operated more efficiently.

According to at least one embodiment of the optoelectronic semiconductor body, the optoelectronic semiconductor body is an optically pumpable emitter. For example, the optoelectronic semiconductor body may be a converter or an optically pumpable laser, or the semiconductor body may be part of such a device. The optoelectronic semiconductor body can thus be optically pumped by another optoelectronic element. In this case, the upper surface of the layer stack may be free of the cover layer to avoid absorption of the electromagnetic radiation emitted by the emitter in the cover layer. By applying the cover layer to the side walls, the emitter can be operated more efficiently.

According to at least one embodiment of the optoelectronic semiconductor body, the optoelectronic semiconductor body is a detector. For example, the optoelectronic semiconductor body may be a detector for detecting electromagnetic radiation or the semiconductor body may be part of such a device.

According to at least one embodiment of the optoelectronic semiconductor body, the layer stack is arranged on the substrate and at least one of the side walls encloses an angle greater than 0° and at most 30° with a crystal direction of the substrate in a plane which is parallel to the main extension plane of the active region. At least one of the side walls extends in the plane which is parallel to the main extension plane of the active region along a first direction. The substrate comprises a crystal structure, wherein a crystal direction of the substrate extends along a second direction. The first direction and the second direction enclose an angle greater than 0° and at most 30° with each other. This arrangement of the layer stack results in the cover layer comprising few defects. In addition, to avoid defects, it is advantageous to minimize the ratio of the perimeter of the layer stack to its area in a plane parallel to the main extension plane of the active region. Furthermore, an arrangement of a plurality of optoelectronic semiconductor bodies is provided. The optoelectronic semiconductor bodies are the optoelectronic semiconductor bodies described here. According to at least one embodiment, the plurality of optoelectronic semiconductor bodies is arranged in a two-dimensional arrangement. The optoelectronic semiconductor bodies may be arranged on a common carrier. In this case, the optoelectronic semiconductor bodies can be arranged at nodes of a two-dimensional grid on the carrier. For example, the optoelectronic semiconductor bodies may comprise equal distances from one another. The arrangement of a plurality of optoelectronic semiconductor bodies can thus be used as an array with a plurality of pixels.

Further, a method for producing an optoelectronic semiconductor body is provided. The optoelectronic semiconductor body is preferably producible by a method described here. In other words, all features disclosed for the optoelectronic semiconductor body and the arrangement of a plurality of optoelectronic semiconductor bodies are also disclosed for the method for producing an optoelectronic semiconductor body and vice versa.

According to at least one embodiment of the method for producing an optoelectronic semiconductor body, the method comprises a method step in which a layer stack with a p-doped region, an active region which is in particular configured to emit and/or receive electromagnetic radiation during operation of the optoelectronic semiconductor body and which comprises a main extension plane, and an n-doped region is grown. The layer stack can be grown epitaxially on a substrate.

According to at least one embodiment of the method for producing an optoelectronic semiconductor body, the method comprises a method step in which the layer stack is etched so that it comprises, at least in the region of the active region, side walls which extend transversely to the main extension plane of the active region. During etching of the layer stack, the n-doped region, the active region and the p-doped region can be partially removed. The layer stack can be etched in such a way that, after etching, the layer stack comprises the shape of a cuboid or a cylinder. The n-doped region, the active region and the p-doped region can be exposed at least partially in the region of the side walls of the layer stack after etching. The layer stack can be etched dry-chemically or wet-chemically or dry-chemically and wet-chemically. For example, the layer stack can first be etched dry-chemically and subsequently wet-chemically.

It is further possible to etch the layer stack in such a way that the side walls have a curved or inhomogeneous structure. For example, the layer stack can be etched more in the region of the active region than in other regions, for example, by irradiating the active region during etching with electromagnetic radiation which is mainly absorbed in the active region. Furthermore, the etching process may depend on the material to be etched. Alternatively, it is possible that the layer stack is etched less in the region of the active region than in other regions. For example, for efficient growth of a cover layer, it may be advantageous to etch the layer stack more in the region of the active region than in other regions.

By etching the layer stack, a plurality of optoelectronic semiconductor bodies can be formed on a carrier. By etching the layer stack, the shape of a single optoelectronic semiconductor body can be defined.

According to at least one embodiment of the method for producing an optoelectronic semiconductor body, the method comprises a method step in which a cover layer is grown at least in places on the side walls of the layer stack. In particular, the cover layer can be grown epitaxially on the side walls. Before the cover layer is grown, a material transport can be induced in the region of the side walls as a result of changed growth conditions. As a result, the cover layer can subsequently be grown with a better quality. In addition, it is possible to transport gallium and indium away from the region of the side walls, so that a larger proportion of aluminum remains in the region of the side walls and the band gap in the region of the side walls is increased.

According to at least one embodiment of the method for producing an optoelectronic semiconductor body, the active region is arranged in stack direction between the p-doped region and the n-doped region. This can mean that the active region is grown on the p-doped region and the n-doped region is grown on the active region. Alternatively, the active region can be grown on the n-doped region and the p-doped region on the active region.

According to at least one embodiment of the method for producing an optoelectronic semiconductor body, the cover layer is formed with at least one semiconductor material. The cover layer may comprise a semiconductor compound. The material of the cover layer can be based in particular on a III-V or a II-VI semiconductor material. For example, the cover layer can be formed with AlGaP, InAlP or ZnSSe. The cover layer can be n-doped and/or p-doped. It is further possible that the cover layer is undoped, in particular nominally.

According to at least one embodiment of the method for producing an optoelectronic semiconductor body, the method comprises the steps of growing a layer stack with an active region which is configured to emit electromagnetic radiation and which comprises a main extension plane, etching the layer stack so that it comprises, at least in the region of the active region, side walls which extend transversely to the main extension plane of the active region, and growing a cover layer at least in places on the side walls of the layer stack, wherein the cover layer is formed with at least one semiconductor material.

By growing the cover layer on the side walls, atoms or molecules of the cover layer can bind to unpaired bonds of the active region. The cover layer can thus act as a passivation for the unpaired bonds. As the number of unpaired bonds in the region of the side walls is reduced by the application of the cover layer, the occurrence of recombination currents during operation of the semiconductor body is reduced. The semiconductor body produced according to the method can thus be operated more efficiently, as the probability of non-radiative recombination is reduced.

According to at least one embodiment of the method for producing an optoelectronic semiconductor body, a masking layer is applied to the layer stack prior to etching the layer stack. For example, the layer stack can be protected by the masking layer so that the layer stack is etched only in the regions in which the masking layer is not arranged. The shape of the optoelectronic semiconductor body can thus be determined by the masking layer. The masking layer can be removed after etching the layer stack. For example, the masking layer can be removed by wet chemical etching. The masking layer can comprise a dielectric material such as $SiO_2$ or SiN.

According to at least one embodiment of the method for producing an optoelectronic semiconductor body, the cover layer is removed from an upper surface of the layer stack. The cover layer can be grown in the region of the side walls and on an upper surface of the layer stack. The upper surface is arranged on the side of the layer stack facing away from the substrate. After the cover layer is grown, it can be removed from the upper surface of the layer stack. This prevents the absorption of electromagnetic radiation emitted by the optoelectronic semiconductor body during operation in the cover layer on the upper surface.

According to at least one embodiment of the method for producing an optoelectronic semiconductor body, the optoelectronic semiconductor body is separated through the cover layer after growing the cover layer. The optoelectronic semiconductor body can, for example, be separated by a sawing process. The optoelectronic semiconductor body can be sawn through the cover layer from the upper surface towards the substrate. This means that the optoelectronic semiconductor body is not separated along the side walls, but at a distance from the side walls. This prevents damage to the side walls during the separation process. Damage to the side walls could, for example, lead to further recombination currents. According to at least one embodiment of the method for producing an optoelectronic semiconductor body, the cover layer is grown by means of metalorganic chemical vapor phase epitaxy (MOCVD). By means of this method, the cover layer can be epitaxially grown on the side walls.

In the following, the optoelectronic semiconductor body described here, the arrangement of a plurality of optoelectronic semiconductor bodies and the method for producing an optoelectronic semiconductor body described here are explained in detail in conjunction with the exemplary embodiments and the associated figures.

Identical, similar or similarly acting elements are marked with the same reference signs in the figures. The figures and the proportions of the elements to each other shown in the figures are not to be regarded as true to scale. Rather, individual elements may be shown in exaggerated size for better representability and/or comprehensibility.

Figure 1:
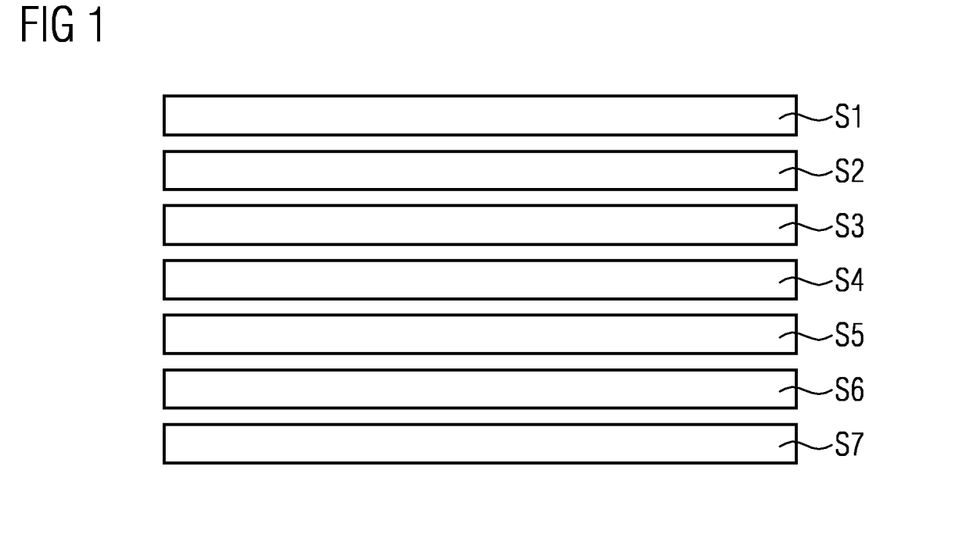
FIG. 1 shows an exemplary embodiment of the method for producing an optoelectronic semiconductor body.

FIG. 1 shows an exemplary embodiment of the method for producing an optoelectronic semiconductor body 10. In a first step S1, a layer stack 11 is grown. The layer stack 11 can be grown on a substrate 20. The layer stack 11 comprises a p-doped region 12, an active region 13 and an n-doped region 14. The active region 13 comprises a main extension plane and is configured to emit or receive electromagnetic radiation during operation of the optoelectronic semiconductor body 10. The active region 13 is arranged in a stack direction R between the p-doped region 12 and the n-doped region 14. A masking layer 19 is applied to the layer stack 11. The masking layer 19 may comprise a dielectric material such as SiO$_2$ or SiN. The masking layer 19 is patterned so that a plurality of individual masking regions 21 are arranged on the layer stack 11. Each masking region 21 defines the size of the layer stack 11 in lateral directions for each optoelectronic semiconductor body 10, wherein the lateral directions extend parallel to the main extension plane of the active region 13.

In a next step S2, the layer stack 11 is etched so that it comprises, at least in the region of the active region 13, side walls 15 which extend transversely to the main extension plane of the active region 13. The layer stack 11 can be dry-chemically etched in this step. This removes the material of the layer stack 11 which is not covered by the masking regions 21. For example, material of the p-doped region 12, the active region 13 and the n-doped region 14 can be removed. Thus, a plurality of layer stacks 11 is formed on the substrate 20. The individual layer stacks 11 are spaced apart from each other. The side walls 15 of the layer stacks 11 extend at least in the region of the active region 13, but not necessarily as far as the substrate 20.

In a next step S3, the layer stacks 11 are etched wet-chemically. In this optional step, the shape of the layer stacks 11 can be defined more precisely. In addition, the layer stacks 11 are cleaned in the region which was etched. Regions in which defects are formed during etching can be removed.

In a next step S4, the growth conditions in an metalorganic chemical vapor phase epitaxy process are adjusted in such a way that material transport takes place in the region of the side walls 15. In this process, for example, material can be transported from the region between two layer stacks 11 to the region of the side walls 15. Thus, the side walls 15 are covered at least in places.

In a next step S5, a cover layer 16 is grown at least in places on the side walls 15 of the layer stack 11. The previous step S4 is optional, but it can improve the growth of the cover layer 16 on the side walls 15. The cover layer 16 is formed with at least one semiconductor material and is grown epitaxially on the side walls 15. The cover layer 16 is grown by means of metalorganic chemical vapor phase epitaxy. It is possible that the cover layer 16 is also grown on an upper surface 17 of the layer stack 11. This may be an undesired parasitic, polycrystalline growth of cover layer 16. The upper surface 17 of layer stack 11 is the side of layer stack 11 facing away from substrate 20.

In a next step S6, the parasitically grown cover layer 16 is removed from the upper surface 17 of layer stack 11, for example, by etching or polishing.

In a next step S7, the optoelectronic semiconductor body 10 is separated through the cover layer 16. This step is optional. A plurality of optoelectronic semiconductor bodies 10 is produced by the separation. The optoelectronic semiconductor bodies 10 can be completely separated. It is further possible that the optoelectronic semiconductor bodies 10 are arranged in a two-dimensional arrangement 18 on a carrier.

Figure 2A:
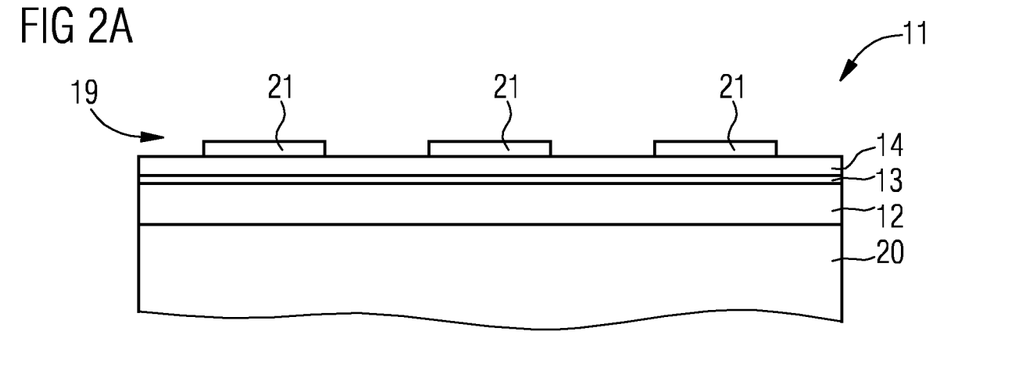
FIGS. 2A, 2B, 2C, 2D, 2E, 2F and 2G show a further exemplary embodiment of the method for producing an optoelectronic semiconductor body.

FIGS. 2A to 2G show a further exemplary embodiment of the method for producing an optoelectronic semiconductor body 10. FIG. 2A shows a schematic cross-section of the layer stack 11. The layer stack 11 is arranged on the substrate 20. The layer stack 11 comprises the p-doped region 12, the active region 13 and the n-doped region 14. The n-doped region 14 is arranged on the active region 13. However, it is also possible that the p-doped region 12 is arranged on the active region 13. The masking layer 19 is arranged on the n-doped region 14. In this step, the masking layer 19 is patterned so that a plurality of masking regions 21 are arranged on the layer stack 11. The masking regions 21 can be evenly distributed on the layer stack 11.

Figure 2B:
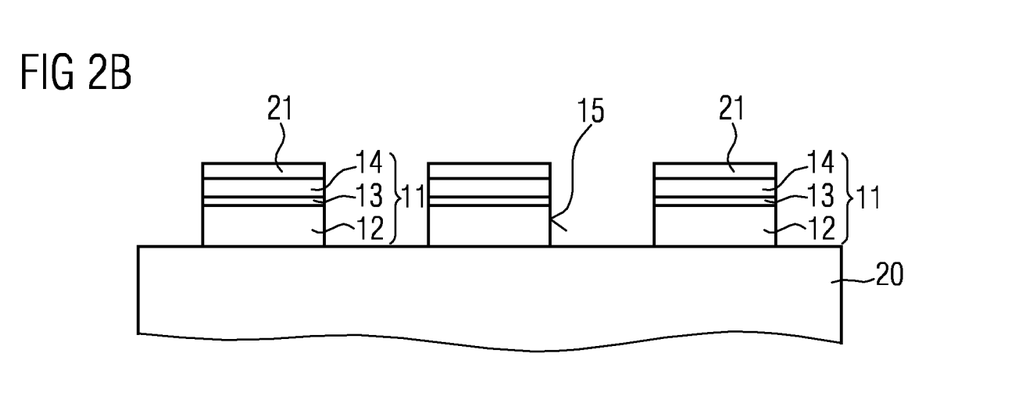

FIG. 2B shows that, in a next step, the layer stack 11 is etched dry-chemically. Thus, a plurality of layer stacks 11 is formed, which are arranged spaced apart from each other. The layer stacks 11 comprise side walls 15 which extend perpendicularly to the main extension plane of the active region 13. The p-doped region 12, the active region 13 and the n-doped region 14 are exposed in the region of the side walls 15.

Figure 2C:
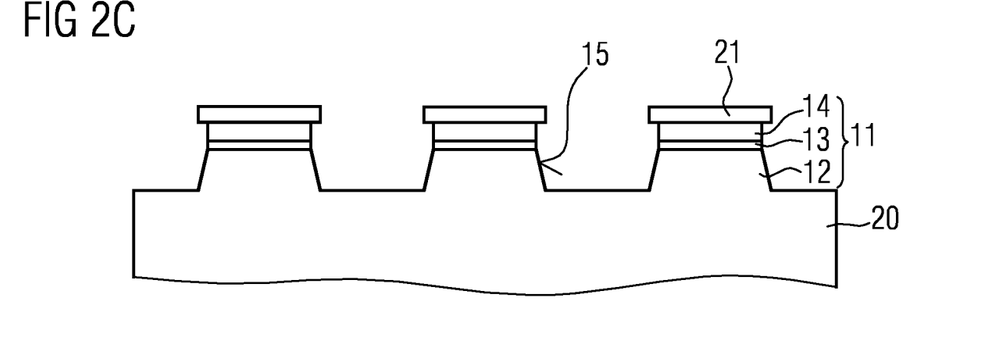

FIG. 2C shows that, in a next step, layer stack 11 is etched wet-chemically. The side walls 15 are etched in such a way that they are inclined, i.e. extend at an angle of less than 90°, to the main extension plane of the active region 13. In the region of the n-doped region 14, the layer stack 11 is undercut under the masking region 21.

Figure 2D:
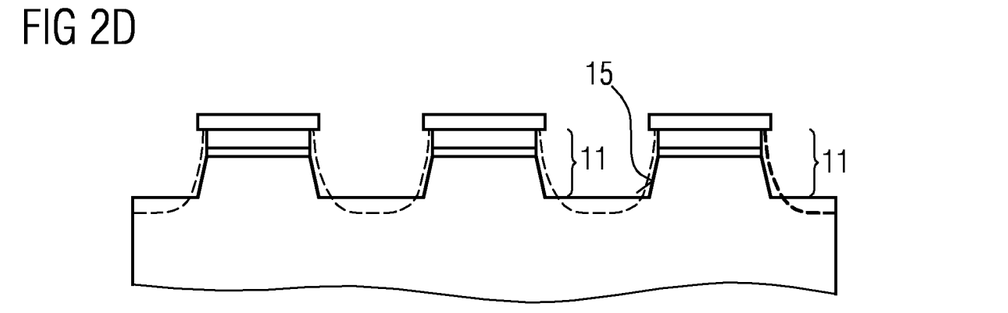

FIG. 2D shows that, in a next step, a material transport is induced in a metalorganic chemical vapor phase epitaxy process. Material from the regions between the layer stacks 11 is transported to the side walls 15. The dotted line shows that, after the material transport, the side walls 15 are covered with material from the regions between the layer stacks 11. The regions between the layer stacks 11 thus comprise a U-shaped profile. Material transport can improve the quality of a subsequently grown cover layer 16.

Figure 2E:
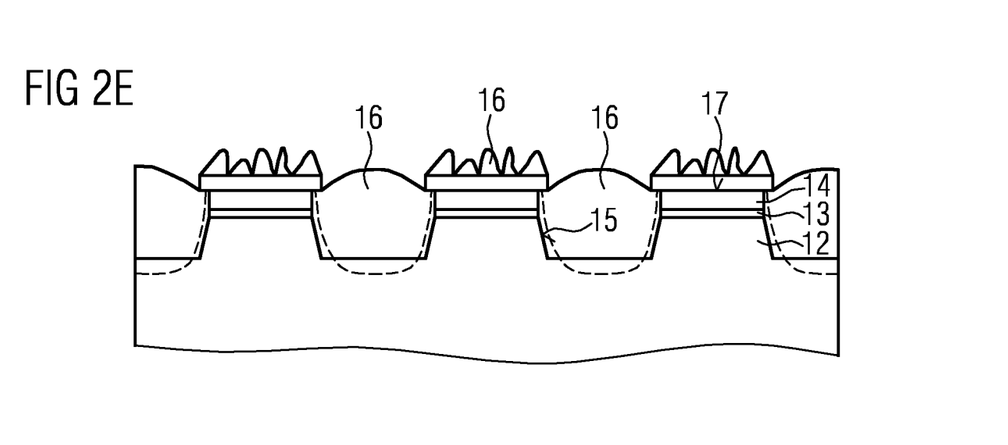

FIG. 2E shows that, in a next step, the cover layer 16 is grown. The cover layer 16 is grown on the side walls 15 and completely covers the regions between the layer stacks 11. Thus, the cover layer 16 completely covers the active region 13 on the side walls 15. In addition, cover layer 16 is grown at least in places on the upper surfaces 17 of layer stacks 11. The parasitic growth of cover layer 16 on the upper surfaces 17 may be undesirable. Covalent bonds may exist between the material of the side walls 15 and the material of the cover layer 16. The lattice mismatch between the material of the cover layer 16 and the material of layer stack 11 is less than 1%. To avoid charge carriers in the region of the side walls 15, the band gap of the material of the cover layer 16 may be larger than the band gap of the material of layer stack 11.

Figure 2F:
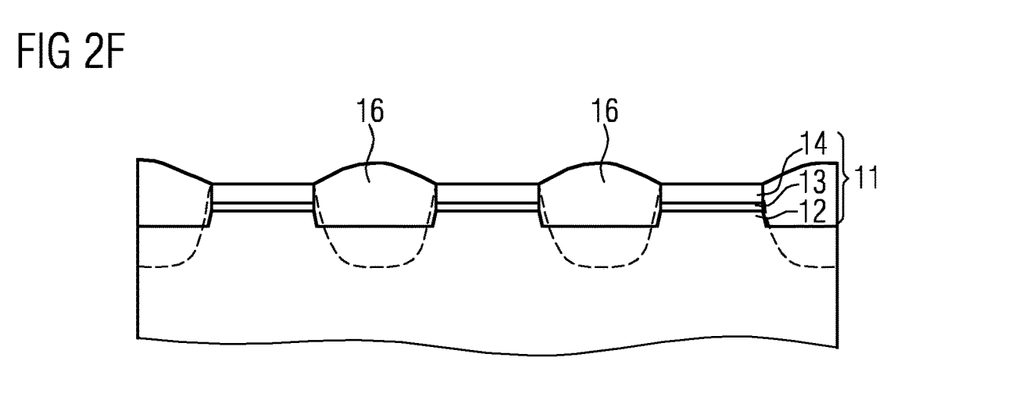

FIG. 2F shows that, in a next step, the masking regions 21 with the cover layer 16 grown thereon are removed. The masking regions 21 can be removed by etching, for example.

Figure 2G:
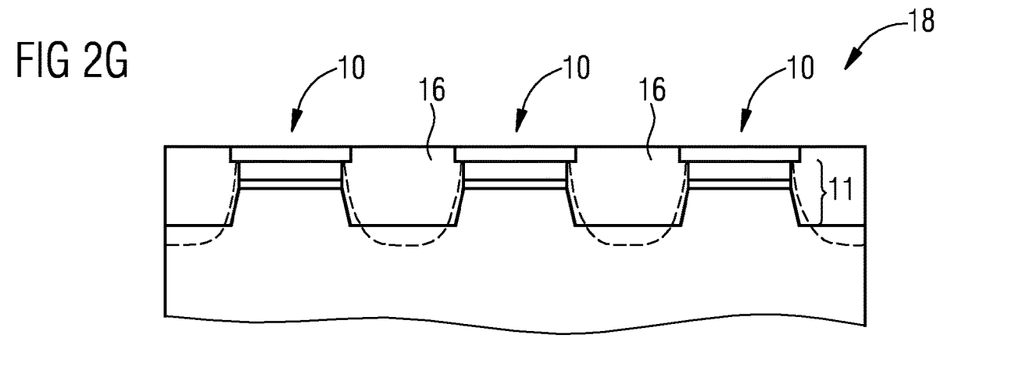

FIG. 2G shows that, in an alternative next step, the cover layer 16 is partially removed so that the upper surface 17 is free of the cover layer 16, and the cover layer 16 terminates flush with the layer stacks 11 on the upper surface 17. For this purpose, the cover layer 16 can be planarized. The masking regions 21 can remain on the layer stacks 11.

FIG. 2G thus shows an arrangement 18 of a plurality of optoelectronic semiconductor bodies 10, in which the plurality of optoelectronic semiconductor bodies 10 is arranged in a two-dimensional arrangement.

Each of the semiconductor optoelectronic bodies 10 may comprise a rectangular cross-section, wherein the cross-section is located in a plane which is parallel to the main extension plane of the active region 13. In this case, the substrate 20 may be formed with GaAs or GaP and comprise a (100) or a (110) surface. A (110) surface of the substrate 20 is advantageous if the layer stack 11 comprises InGaAlP to avoid a regular arrangement of the semiconductor compound. The arrangement of the individual atoms within an InGaAlP compound can influence the band gap. In addition, the method described here is advantageous in avoiding the growth of a cover layer 16 with a (111)A surface.

It is further possible that each of the optoelectronic semiconductor bodies 10 comprises a hexagonal cross-section. In this case, the substrate 20 can be formed with GaAs or GaP and comprise a (111)B surface.

Figure 3A:
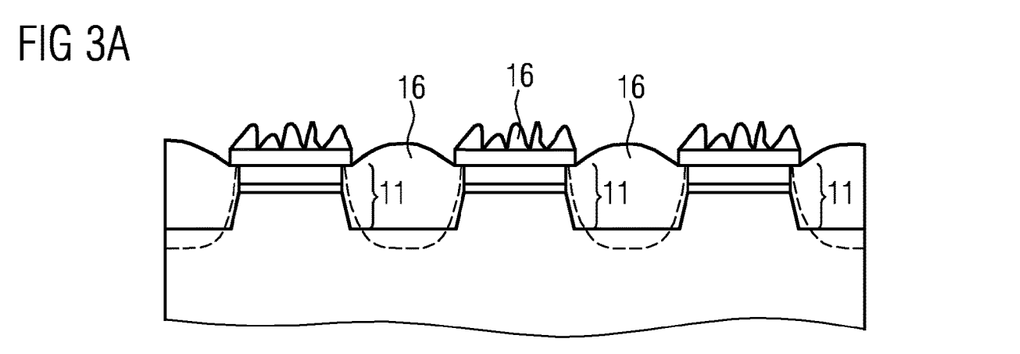
FIGS. 3A and 3B show an example of the growth of the cover layer.

FIGS. 3A and 3B show an example of the growth of cover layer 16. FIG. 3A shows a schematic sectional view of three layer stacks 11 with a cover layer 16 arranged between each of them. Each cover layer 16 comprises a convex shape. The shape of the cover layer 16 can be influenced by the amount of material provided to grow the cover layer 16.

Figure 3B:
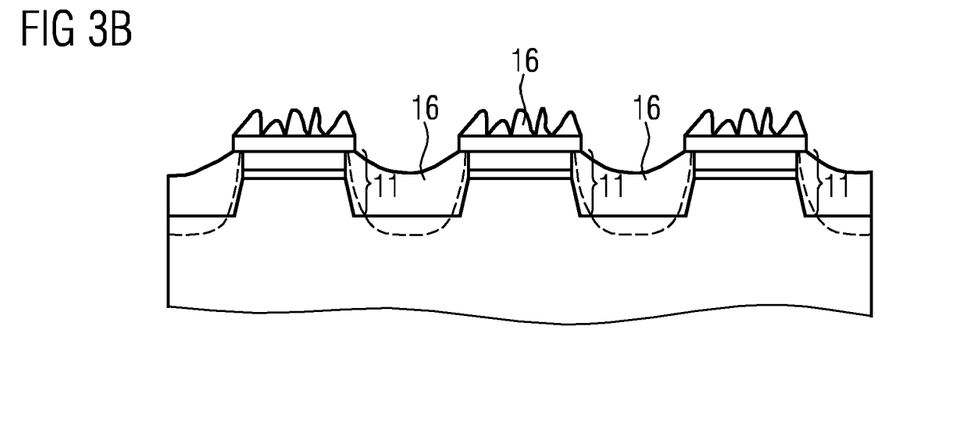

FIG. 3B shows a schematic sectional view of three layer stacks 11 with a cover layer 16 arranged between each of them. In contrast to FIG. 3A, the cover layer 16 comprises a concave shape. In both cases, in FIG. 3A and FIG. 3B, the cover layer 16 also grows parasitically on the upper surface 17.

Figure 4A:
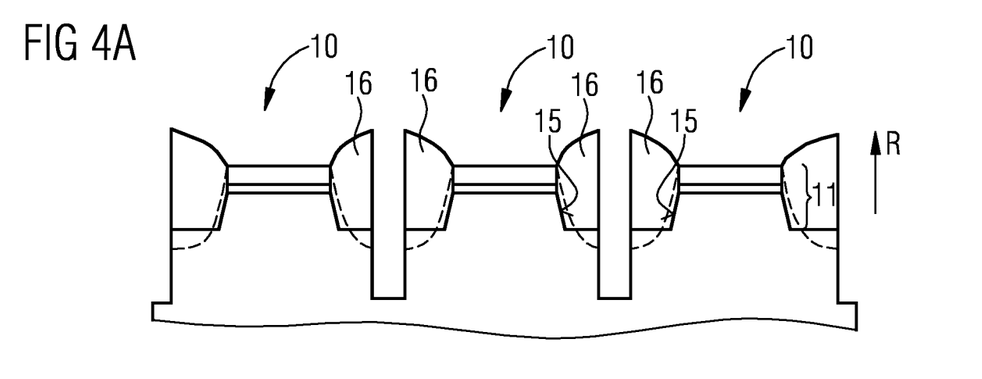
FIGS. 4A and 4B show examples of the separation of exemplary embodiments of optoelectronic semiconductor bodies.

FIG. 4A shows the separation of the optoelectronic semiconductor bodies 10 according to an exemplary embodiment. A schematic sectional view through three optoelectronic semiconductor bodies 10 is shown. The three optoelectronic semiconductor bodies 10 are shown as an example and it is possible that a plurality of optoelectronic semiconductor bodies 10 are arranged side by side. A cover layer 16 is arranged between each of the optoelectronic semiconductor bodies 10. The optoelectronic semiconductor bodies 10 are separated through the cover layer 16. In this case, the cover layer 16 protrudes above the layer stack 11 in stack direction R. Since the optoelectronic semiconductor bodies 10 are separated through the cover layer 16, the side walls 15 are free of traces of a separation process.

Figure 4B:
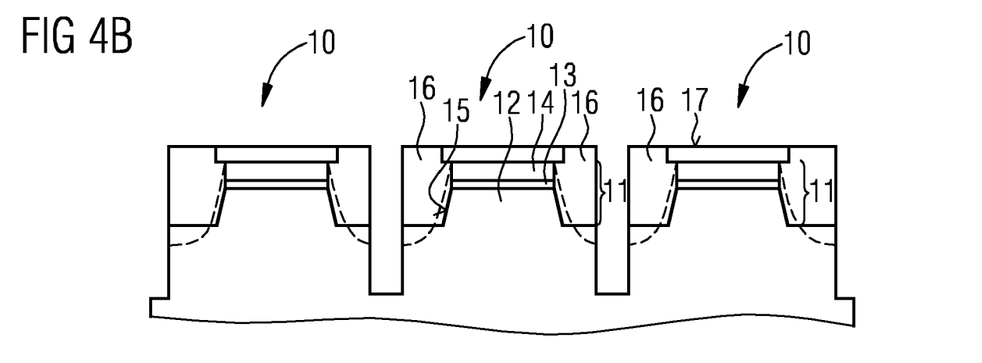

FIG. 4B shows the separation of the optoelectronic semiconductor bodies 10 according to another exemplary embodiment. The structure corresponds to the structure in FIG. 4A, with the difference that the cover layer 16 terminates flush with the layer stack 11 on the upper surface 17. The separated optoelectronic semiconductor bodies 10 can be electrically pumpable emitters such as light emitting diodes. It is further possible that the separated optoelectronic semiconductor bodies 10 are optically pumpable emitters such as converters.

Each of the optoelectronic semiconductor bodies 10 comprises the layer stack 11 with the p-doped region 12, the active region 13 and the n-doped region 14. The active region 13 is arranged in stack direction R between the p-doped region 12 and the n-doped region 14, and the layer stack 11 comprises the side walls 15, which extend transversely to the main extension plane of the active region 13. In addition, the side walls 15 are covered at least in places with the cover layer 16, which is formed with at least one semiconductor material.

Figure 5A:
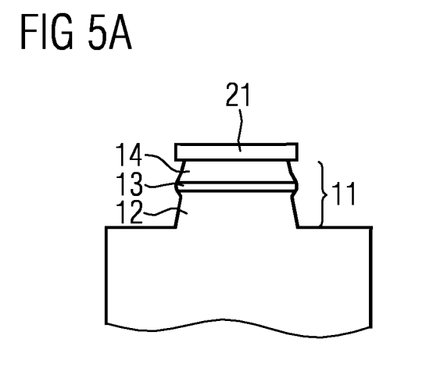
FIGS. 5A, 5B, 5C and 5D show examples of the growth of the cover layer.

FIGS. 5A, 5B, 5C, and 5D are examples of the growth of the cover layer 16. FIG. 5A shows a schematic sectional view through a layer stack 11 according to an exemplary embodiment. The p-doped region 12 and the n-doped region 14 have been etched more strongly than the active region 13. In this case, the active region 13 can be formed with InGaAlP and the n-doped region 14 and the p-doped region 12 can be formed with InAlP.

Figure 5B:
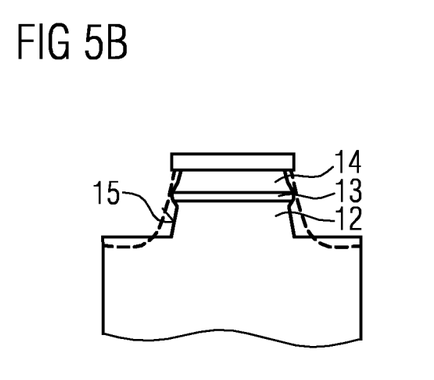

FIG. 5B shows that, in a next step of the method for producing an optoelectronic semiconductor body 10, material transport is induced in the region of the side walls 15. The material transport of, for example, indium and/or gallium in the region of the active region 13 at the side walls 15 is intensified by the curvature of the active region 13 in the region of the side walls 15. Thus, after the material transport in the active region 13, a semiconductor compound remains in the region of the side walls 15 which comprises less indium and/or gallium and thus has a larger band gap. A larger band gap in the region of the side walls 15 is advantageous to reduce or prevent leakage currents.

Figure 5C:
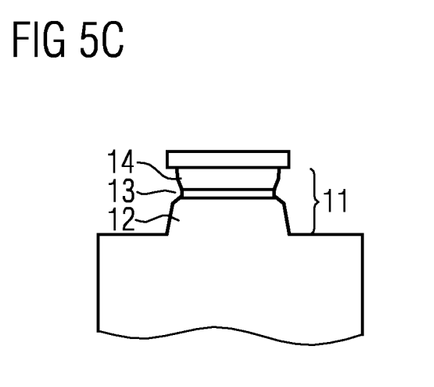

FIG. 5C shows a schematic sectional view through a layer stack 11 according to another exemplary embodiment. The active region 13 was etched more strongly than the p-doped region 12 and the n-doped region 14, for example by irradiating the active region 13 during etching with electromagnetic radiation, which is mainly absorbed in the active region 13.

Figure 5D:
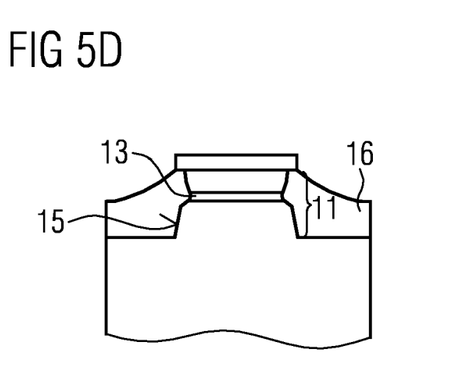

FIG. 5D shows that, in a next step of the method for producing an optoelectronic semiconductor body 10, the cover layer 16 is grown on the side walls 15. Since the active region 13 has been etched more strongly than other regions of the layer stack 11, the cover layer 16 comprises a greater thickness in the region of the active region 13 than in other regions. Atoms of the cover layer 16 can therefore advantageously bind to unpaired bonds of the active region 13 and recombination currents in the region of the side walls 15 are reduced or avoided.

Figure 6:
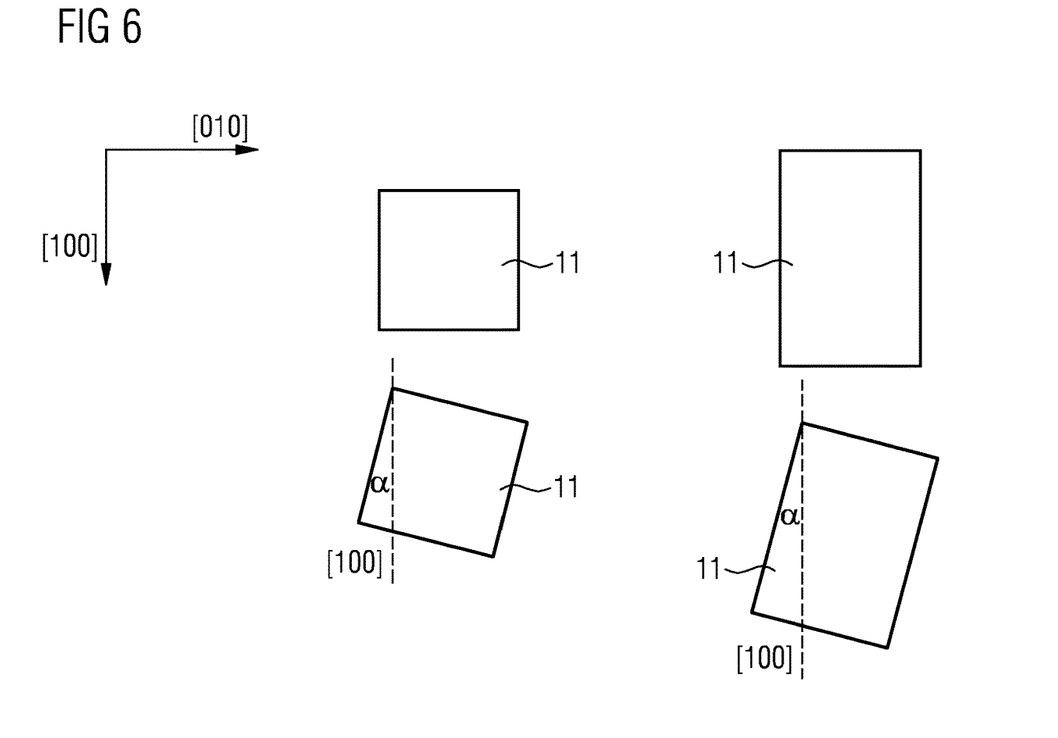
FIGS. 6 and 7 show top views of exemplary embodiments of the layer stack for exemplary embodiments of semiconductor bodies described here.

FIG. 6 shows top views of exemplary embodiments of layer stack 11. The layer stack 11 of the optoelectronic semiconductor body 10 is arranged on a substrate 20. The substrate 20 comprises a crystal structure. FIG. 6 shows two crystal directions of the substrate 20 in top view, namely the [100] and the [010] direction. In the exemplary embodiment on the left, the layer stacks 11 comprise a square cross-section. The layer stack 11 can be arranged along a crystal direction of the substrate 20 as shown in the upper left corner. In the exemplary embodiment of layer stack 11 shown below, at least one of the side walls 15 of layer stack 11 encloses an angle α greater than 0° and at most 30° with the [100] direction of substrate 20 in a plane parallel to the main extension plane of active region 13. In the exemplary embodiment on the right, the layer stacks 11 comprise a rectangular cross-section. In this case, the layer stack 11 can be arranged along a crystal direction of the substrate 20, as shown in the upper right corner. In the exemplary embodiment of layer stack 11 shown below, at least one of the side walls 15 of layer stack 11 encloses an angle α greater than 0° and at most 30° with the [100] direction of substrate 20 in a plane parallel to the main extension plane of active region 13.

Figure 7:
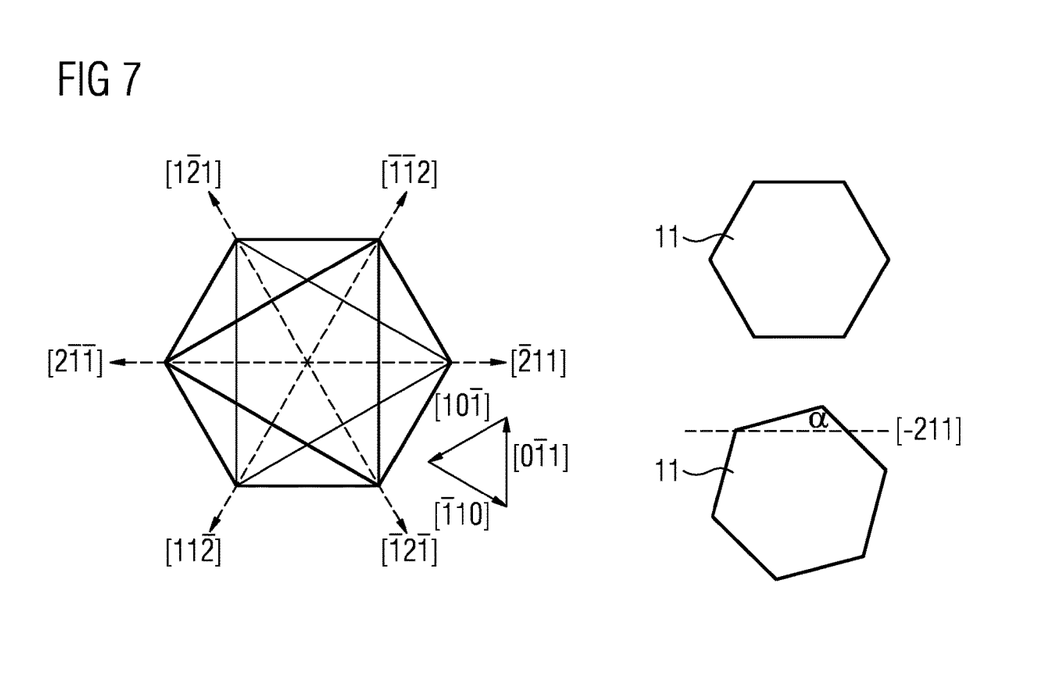

FIG. 7 shows top views of other exemplary embodiments of layer stack 11. The substrate 20, on which the layer stack 11 is arranged, comprises a hexagonal crystal structure. On the left in FIG. 7, different directions of the crystal structure of substrate 20 are shown in top view. On the right side in FIG. 7, two exemplary embodiments of layer stack 11 are shown, in which layer stack 11 comprises a hexagonal cross-section. In the upper exemplary embodiment, the layer stack 11 is arranged along the crystal directions of the substrate 20. In the lower exemplary embodiment, at least one of the side walls 15 of the layer stack 11 encloses an angle α greater than 0° and at most 30° with the [−211] direction of the substrate 20 in a plane parallel to the main extension plane of the active region 13.

The features and exemplary embodiments described in conjunction with the figures can be combined with each other according to further exemplary embodiments, even if not all combinations are explicitly described. Furthermore, the exemplary embodiments described in conjunction with the figures may alternatively or additionally comprise further features according to the description in the general part.

The invention is not limited to the exemplary embodiments by the description thereof. Rather, the invention comprises each new feature as well as each combination of features, which in particular includes each combination of features in the claims, even if this feature or this combination itself is not explicitly disclosed in the claims or exemplary embodiments.

REFERENCES

10: optoelectronic semiconductor body
11: layer stack
12: p-doped region
13: active region
14: n-doped region
15: side wall
16: cover layer
17: upper surface
18: arrangement
19: masking layer
20: substrate
21: masking region
R: stack direction
S1, S2, S3, S4, S5, S6, S7: steps

The invention claimed is:

1. An optoelectronic semiconductor body, comprising:
a layer stack with:
an active region, which is configured to emit electromagnetic radiation and which comprises a main extension plane, wherein p1 the layer stack comprises a hexagonal shape in a plane parallel to the main extension plane of the active region,
the layer stack comprises a p-doped region and an n-doped region, wherein the active region is arranged in the stack direction between the p-doped region and the n-doped region,
the p-doped region and the n-doped region each have sidewalls that face each other and overlap in a plane that is perpendicular to the main extension plane of the active region,
a mask layer comprising a dielectric material is arranged on an upper surface of the layer stack, the layer stack is undercut under the mask layer,
the layer stack comprises side walls which extend transversely to the main extension plane of the active region,
the entire side walls are covered completely with a cover layer which is formed with at least one semiconductor material,
the cover layer completely covers and is in direct contact with the active region on the side walls,
an upper surface of the layer stack is free of the cover layer,
the cover layer does not comprise a (111) A surface on its upper surface,
the side walls comprise an inhomogeneous shape and covalent bonds exist between a material of the side walls and a material of the cover layer,
the side walls are etched more in the region of the active region than in other regions,
the cover layer comprises a greater thickness in the region of the active region than in other regions, and
an extension of the cover layer perpendicular to the main extension plane of the active layer has its maximum at the side walls.

2. The optoelectronic semiconductor body according to claim 1, in which the lattice mismatch between a material of the cover layer and a material of the layer stack is less than 1%.

3. The optoelectronic semiconductor body according to claim 1, in which the band gap of a material of the cover layer is larger than the band gap of a material of the layer stack.

4. The optoelectronic semiconductor body according to claim 1, in which the side walls are free of traces of a separation process.

5. The optoelectronic semiconductor body according to claim 1, in which the optoelectronic semiconductor body is an electrically pumpable emitter or the optoelectronic semiconductor body is an optically pumpable emitter.

6. The optoelectronic semiconductor body according to claim 1, in which the layer stack is arranged on a substrate and at least one of the side walls encloses an angle greater than 0° and at most 30° with a crystal direction of the substrate in a plane which is parallel to the main extension plane of the active region.

7. An arrangement of a plurality of optoelectronic semiconductor bodies of claim 1, in which the plurality of optoelectronic semiconductor bodies is arranged in a two-dimensional arrangement.

8. An optoelectronic semiconductor body, comprising:
a layer stack with:
an active region, which is configured to emit electromagnetic radiation and which comprises a main extension plane, wherein
the layer stack comprises a hexagonal shape in a plane parallel to the main extension plane of the active region,
the layer stack comprises a p-doped region and an n-doped region, wherein the active region is arranged in the stack direction between the p-doped region and the n-doped region, the p-doped region and the n-doped region each have sidewalls that face each other and overlap in a plane that is perpendicular to the main extension plane of the active region, a mask layer comprising a dielectric material is arranged on an upper surface of the layer stack, the mask layer is arranged on the n-doped region and, in the region of the n-doped region, the layer stack is undercut under the mask layer, the layer stack comprises side walls which extend transversely to the main extension plane of the active region, the entire side walls are covered completely with a cover layer which is formed with at least one semiconductor material, the cover layer completely covers and is in direct contact with the active region on the side walls, an upper surface of the layer stack is free of the cover layer, the cover layer does not comprise a (111) A surface on its upper surface, the side walls comprise an inhomogeneous shape and covalent bonds exist between a material of the side walls and a material of the cover layer, the side walls are etched more in the region of the active region than in other regions, the cover layer comprises a greater thickness in the region of the active region than in other regions, and an extension of the cover layer perpendicular to the main extension plane of the active layer has its maximum at the side walls.

9. A method for producing an optoelectronic semiconductor body comprising:

growing a layer stack with an active region which is configured to emit electromagnetic radiation and which comprises a main extension plane, etching the layer stack so that it comprises, at least in the region of the active region, side walls which extend transversely to the main extension plane of the active region, and growing a cover layer at least in places on the side walls of the layer stack, wherein the cover layer is formed with at least one semiconductor material, the side walls comprise an inhomogeneous shape and covalent bonds exist between a material of the side walls and a material of the cover layer, and the active region is more strongly etched than the p-doped region and the n-doped region, wherein before the cover layer is grown, a material transport is induced in the region of the side walls as a result of changed growth conditions, wherein material from the regions between the layer stacks is transported to the side walls.

10. The method according to claim 9, in which a masking layer is applied to the layer stack prior to etching the layer stack.

11. The method according to claim 9, in which the cover layer is removed from an upper surface of the layer stack.

12. The method according to claim 9, in which the optoelectronic semiconductor body is separated through the cover layer after growing the cover layer.

13. The method according to claim 9, in which the cover layer is grown by metalorganic chemical vapor phase epitaxy.

14. The method according to claim 9, in which the layer stack is etched more in the region of the active region than in other regions by irradiating the active region during etching with electromagnetic radiation.

* * * * *

UNITED STATES PATENT AND TRADEMARK OFFICE
CERTIFICATE OF CORRECTION

PATENT NO. : 12,100,783 B2
APPLICATION NO. : 17/050793
DATED : September 24, 2024
INVENTOR(S) : Tansen Varghese et al.

It is certified that error appears in the above-identified patent and that said Letters Patent is hereby corrected as shown below:

In the Specification

Column 13, Line 61: "p1 the layer" should be -- the layer --.

Signed and Sealed this
Twenty-ninth Day of October, 2024

Katherine Kelly Vidal
*Director of the United States Patent and Trademark Office*